United States Patent [19]

Culp

[11] Patent Number: 5,281,899
[45] Date of Patent: Jan. 25, 1994

[54] ELECTRICAL DRIVE FOR A SEGMENTED TRANSDUCER

[75] Inventor: Gordon W. Culp, Van Nuys, Calif.

[73] Assignee: Rockwell International Corporation

[21] Appl. No.: 743,069

[22] Filed: Aug. 9, 1991

Related U.S. Application Data

[63] Continuation of Ser. No. 488,548, Mar. 5, 1990, abandoned.

[51] Int. Cl.⁵ .................................................. H01L 41/08
[52] U.S. Cl. .................................... 318/116; 310/316; 310/317; 310/323; 310/328
[58] Field of Search ............... 310/316, 317, 323, 328; 318/116

[56] References Cited

U.S. PATENT DOCUMENTS

| | | | |
|---|---|---|---|
| 4,468,583 | 8/1984 | Mori | 310/328 |
| 4,608,506 | 8/1986 | Tanuma | 310/317 X |
| 4,622,483 | 11/1986 | Staufenberg, Jr. et al. | 310/328 |
| 4,628,275 | 12/1986 | Skipper et al. | 330/10 |
| 4,692,672 | 9/1987 | Okuno | 318/116 |
| 4,709,183 | 11/1987 | Lange | 310/328 |
| 4,727,278 | 2/1988 | Staufenberg, Jr. et al. | 310/328 |
| 4,841,191 | 6/1989 | Takata et al. | 310/317 |
| 4,928,030 | 5/1990 | Culp | 310/317 X |
| 4,947,077 | 8/1990 | Murata | 310/317 X |
| 4,953,413 | 9/1990 | Iwata et al. | 310/317 X |
| 4,983,875 | 1/1991 | Masaki et al. | 310/317 X |

*Primary Examiner*—Mark O. Budd
*Attorney, Agent, or Firm*—H. Fredrick Hamann; Harry B. Field; John McFarren

[57] ABSTRACT

An electronic system is provided for stimulating a segmented transducer with resonant electrical signals to produce a nonsinusoidal transducer output. In an illustrative embodiment, the transducer comprises a segmented piezoelectric actuator. The actuator comprises stacked piezoelectric dimorphs forming the actuator segments, each of which reacts electrically as a capacitance. Each segment (capacitance) is connected in a loop in electrical series with an external capacitor or a corresponding segment of a second actuator. An electrical controller stimulates each loop with a separate resonant electrical signal related to the others in frequency, phase, amplitude, and polarity. The resulting output of each actuator is the vector sum of the mechanical outputs of the individual dimorphs of that actuator. In an ideal resonant drive system for a segmented transducer, the only electrical energy used is that which is converted directly to mechanical work by the actuator. All other temporarily stored electric and elastic energy is recycled within the loops for high efficiency. When the electrical waveforms drive a pair of actuators, electrical charge oscillates between the actuators. Thus, loop currents flow between essentially lossless reactive components rather than through high-loss output devices.

27 Claims, 2 Drawing Sheets

ELECTRICAL DRIVE FOR A SEGMENTED TRANSDUCER

This is a continuation of copending application Ser. No. 07/488,548 filed on Mar. 5, 1990, now abandoned.

TECHNICAL FIELD

The present invention relates to electrical transducers and, in particular, to a resonant electrical system for driving a segmented transducer.

BACKGROUND OF THE INVENTION

The output capability of electrical transducers can be modified and expanded by selectively stimulating joined transducer segments. For example, piezoelectric actuators, an illustrative class of electrical transducers, can be constructed of stacked segments to provide a three-dimensional mechanical output. By combining cyclically alternating traction strokes of two or more piezoelectric actuators, "walking" motion can be produced.

At the start of tractional contact in conventional resonant actuators, such as resonant ultrasonic traveling wave motors, relative velocity between the actuator and a movable object results in initial sliding until firm contact is established. At the end of the traction portion of the cycle, sliding occurs again in preparation for the lift-off and retrace portions of the cycle. In such a system efficiency of electromechanical power conversion is reduced by sliding friction, particularly on retrace when the relative velocity is greatest. The electromechanical conversion efficiency of an actuating device with a conventional resonant drive is generally less than about 40%, with most of the loss caused by sliding friction. Rotors of resonant traveling wave piezoelectric motors are known to become uncomfortably hot to the touch after a few minutes of operation. Furthermore, resonant actuators that use circular or elliptical traction paths impart a time-varying normal force and a time-varying tangential (traction) force to the positioned object or rotor. As a result, linear motion is jerky and motors have torque ripple.

The speed of action of resonant actuators may be adjusted by altering the magnitude of the voltage swings or the mechanical strokes. However, resonant devices operate most efficiently at full power and full speed. Speed reduction by reducing amplitude also reduces efficiency because the energy allocated to sliding friction becomes an increasing fraction of the total available energy. As the size of the circular or elliptical motion is decreased, rubbing during retrace is exacerbated. The lower limit of speed is determined by the resonant amplitude at which traction cycling becomes intermittent or ceases altogether. Holding a controlled stationary position and applying a static traction force are beyond the operating scope of a resonant actuator.

Resonantly excited piezoelectric actuators of the prior art employ the thickness or extension piezoelectric deformation mode, wherein ferroelectric polarization is parallel to the applied electric field. Such polarization is degraded or even reversed if the applied potential causes an electric field anti-parallel to the direction of polarization. Resonance requires that large voltage swings be substantially symmetric about a floating median potential value. Elevation of the floating median value by at least half the peak-to-peak voltage swing above electrical ground avoids depolarization. This requires that the electrical circuitry operate at a relatively high voltage above ground, resulting in a safety hazard in large actuators.

Slowly varying direct current electrical sources, such as programmable DC power supplies, for example, have been used to control piezoelectric positioners. These power sources emulate class A amplifiers but have a restricted frequency response. All the reactive capacitive current flows through the amplifier output devices. A class A amplifier dissipates all of the available power internally under null excitation. The variable DC voltage is essentially free of superimposed high frequency ripple, and it provides smooth control and piezoelectric positioning at slow speeds (including zero speed) with relatively good positioning accuracy. At modest frequencies and voltages, programmable DC power supplies operate piezoelectric actuators as smooth walkers without losses from sliding friction. However, high efficiency is beyond the capability of a programmable DC power supply emulating a class A or class B amplifier. Operation becomes more difficult and less efficient above a few traction cycles per second or with voltages above about 200 volts. Furthermore, none of the known class A or class B linear amplifiers remain stable when driving an entirely capacitive load. Therefore, they ar not applicable to electromechanically efficient piezoelectric walking actuators except at the lowest portion of the amplifier's frequency band.

An electronic drive described in U.S. Pat. No. 4,628,275 issued to Skipper, et al. emulates a class A amplifier. The amplifier provides the high bipolar voltage swings necessary to operate piezoelectric shear actuators. However, the ultrasonic charge transfer cycles of the amplifier, even when holding a steady voltage, accelerate the rate of wear and fatigue in all mechanisms connecting the actuator to positioned objects. Furthermore, the amplifier requires high voltage DC power supplies, large and heavy transformers, and very fast switching devices to achieve modest electrical efficiencies. The use of AC-to-DC power converters and the presence of large reactive currents in output switching devices preclude efficiencies above about 80%.

Piezoelectric actuators capable of smooth walking are inherently well suited to operation in a vacuum, such as in orbiting space stations, because lubrication is not required. The high electromechanical efficiency of piezoelectric actuators, which exceeds 98% neglecting internal electrical losses, also precludes excessive heating during operation, thus eliminating the need for ancillary cooling that reduces overall system efficiency. Furthermore, piezoelectric actuators require no additional energy from the power source to maintain a stationary force.

Operation in a vacuum imposes similar thermal management requirements on the drive electronics. The need for heat removal decreases dramatically with increasing efficiency. Internal heat generation by an ideal electrical power source is negligible when piezoelectric actuators apply a stationary force or operate at low velocities. Ideally, the energy supplied by the drive system should equal the energy converted to useful mechanical work by the actuators. Thus, there is a need for a highly efficient electrical system to supply appropriate resonant waveforms for nonsinusoidal transducer output such as smooth walking motion by piezoelectric actuators.

SUMMARY OF THE INVENTION

Electromechanical resonance in a conventional transducer produces a sinusoidal output that is most easily described by sine and cosine waves that generate elliptical or circular mechanical output. In contrast, the present invention comprises an electrical system for driving a segmented transducer to produce arbitrary output waveforms. Each segment of the transducer is connected to an electrical controller by a separate electrical loop. The electrical controller provides a separate resonant electrical signal on each loop to stimulate each individual segment of the transducer. Each segment reacts to the resonant electrical stimulation on its loop. However, because the segments are coupled to form the transducer, the overall output of the transducer, typically in the form of force or motion, comprises the vector sum (neglecting coupling effects) of the output reactions of the individual segments of the transducer. Thus, the system of the present invention provides the capability of generating a nonsinusoidal transducer output at high efficiency by the process of mechanically summing a plurality of individual segment reactions produced by a corresponding plurality of resonant electrical stimulations.

The system of the present invention can generate a wide variety of output waveforms by the selection of appropriate electrical loop frequencies and Fourier coefficient amplitudes. By way of example and not limitation, the present system is applicable to piezoelectric actuators, electromagnetic actuators, magnetostrictive actuators, and thermal expansion devices. Also, periodic disturbances in many types of machinery and in delicate instruments, such as optical benches, are characteristically nonsinusoidal and can be reduced or cancelled by application of the principles of the present invention.

BRIEF DESCRIPTION OF THE DRAWINGS

For a more complete understanding of the present invention and for further advantages thereof, the following Description of the Preferred Embodiment makes reference to the accompanying Drawings, in which.

DETAILED DESCRIPTION OF THE INVENTION

The present invention comprises a system for driving electrical transducers, such as piezoelectric actuators, to produce nonsinusoidal transducer output. Although the following description concentrates on piezoelectric actuators as a representative class of transducers, the present invention is suitable for driving any type of segmented electrical transducer.

Figure 1:
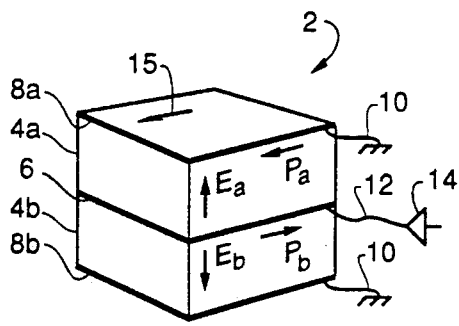
FIG. 1 is a perspective view of a piezoelectric dimorph.
Figure 2:
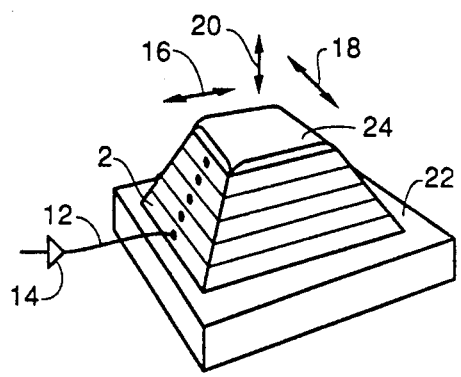
FIG. 2 is a perspective view of a piezoelectric actuator comprising a plurality of stacked dimorphs.
Figure 3:
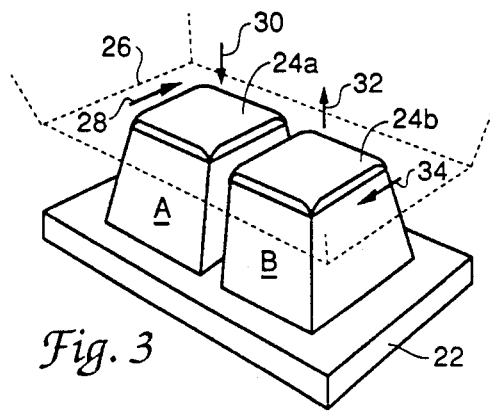
FIG. 3 is a perspective view of adjacent actuators positioned for walking.

For a clear understanding of the present invention, FIGS. 1-3 provide an introduction to layered piezoelectric actuators. FIG. 1 shows a piezoelectric cell 2, called a "dimorph." Dimorph 2 comprises piezoelectric layers 4a and 4b, a central electrode film 6 for connection by lead 12 to an electronic drive 14, and electrode films 8a and 8b for connection to ground leads 10. Piezoelectric layers 4a and 4b are polarized in directions indicated by arrows $P_a$ and $P_b$, respectively. The term "dimorph," therefore, means a piezoelectric cell having two complementary layers of piezoelectric shear material with grounded outer electrodes.

When drive 14 applies a negative electric potential to electrode 6, an electric field is established in the direction indicated by arrow $E_b$ in layer 4b. Holding electrode 8b stationary in space, the combination of field $E_b$ and polarization $P_b$ causes shear such that electrode 6 translates parallel to electrode 8b in direction 15. Because the piezoelectric polarization direction $P_a$ in layer 4a is anti-parallel to the polarization direction $P_b$ in layer 4b, the negative potential applied to electrode 6 establishes an electric field $E_a$ anti-parallel to the field $E_b$ in layer 4b. This combination of polarization and electric field causes layer 4a to shear such that electrode 8a translates relative to electrode 6 in direction 15.

The translations of the piezoelectric layers have the same magnitude and direction when the two layers have congruent geometries and equivalent piezoelectric properties. The two layers are connected in electrical parallel and in mechanical series. Thus, electrode 8a translates relative to electrode 8b by the vector sum of the translations of the individual layers. The application of a positive potential to electrode 6 reverses the directions of the illustrated electric fields, thereby reversing the direction of the shear translations. Electrodes 8a and 8b are maintained at electrical ground, and electrode 6 is centrally located between the ground electrodes to maintain symmetry of current loops. Electrode 6 is driven most effectively with a bipolar signal having equal positive and negative peak potentials. Bipolar drive does not depolarize the layers because the electric fields are perpendicular to the directions of polarization. Bipolar drive doubles the shear piezoelectric translation compared to the monopolar drive used for conventional piezoelectric actuators operated in the thickness or extension modes. In addition, the piezoelectric shear deformation of dimorph 2 per unit electric field intensity is generally greater compared with other piezoelectric polarization modes.

Dimorph 2 may be used as an electromechanical positioner and transducer of force. Predetermined alternate dispositions of electrodes and polarization directions result in dimorphs that translate in one of three desired orthogonal directions. One, two, or three shear deformation dimorphs may be combined into an actuator to provide one, two, or three positioning axes, respectively. A shear actuator can be made by coupling dimorphs together in any order and number and with any desired combination of orthogonal motional directions. Grounded outer electrodes allow electrical and mechanical connection of dimorphs to each other and to other electrically conducting structural members without regard to the electrical state of the bonds.

Ancillary electrical insulators are not needed when stacking dimorphs to form actuators. Elimination of insulators improves electromechanical performance by eliminating unnecessary elastic insulator compliance and by minimizing the distance from a structural attachment to the point of actuator-applied force. In addition, all grounded electrodes may be interconnected and attached to ground at a single location.

FIG. 2 shows a piezoelectric actuator comprising a base 22, a plurality of stacked dimorphs such as dimorph 2, and a protective "tractor" or "foot" 24. Each of the plurality of dimorphs is connected to electronic drive 14 with a connection such as lead 12 connecting dimorph 2. Ground leads connected to electrodes between dimorphs are omitted for clarity. The dimorphs are coupled together and affixed to structural supporting base 22. Tractor 24 is affixed to the electrically positionable actuator end remote from base 22. The position of tractor 24 is the vector sum of dimorph translations (neglecting coupling effects). as indicated by directional arrows 16, 18, and 20.

The commonly used ferroelectric form of piezoelectric material comprises a collection of electric domains, each of which aligns at a different speed in response to a applied steady electric potential. For example, when a steady voltage step is applied to the actuator, those domains that align quickly achieve the majority of mechanical stroke in a relatively short time. Regardless of the steadiness of the applied potential after the step change, the mechanical stroke approaches its full extent asymptotically as the slower domains align with the electric field, which may be called drift. It is desirable in many applications of piezoelectric actuators to provide a mechanical stroke that faithfully follows the magnitude of the applied electric potential. One known method is the use of a position detector to close a control (feedback) loop with the actuator and its electrical drive. The advantage of loop control positioning is the elimination of positioning errors due to drift.

For reasons of clarity but not limitation, the following description includes piezoelectric actuators having only two orthogonal tractor motions, normal (i.e., perpendicular) and tangential. Extrapolations to three orthogonal motions are easily derived by one skilled in the art. Tractor 24 positions a movable object by contact friction, or traction. The movable object may be an actuator rod or a motor shaft, for example. At least one surface of the movable object proximate the tractor is a traction surface called a "tractee." Dimorphs that move tractor 24 in direction 16, tangential to the tractee, are called "tangenters," while dimorphs that move tractor 24 in direction 20, perpendicular to the tractee, are called "lifters."

FIG. 3 illustrates a pair of piezoelectric actuators A and B affixed to base 22 for moving and positioning tractee 26 (shown in phantom) by walking motion. A system for moving and positioning tractee 26 may comprise a plurality of actuators similar to actuators A and B. Motions of tractors 24a and 24b and tractee 26 are measured relative to fixed base 22. Electronic drives and connections are omitted for clarity. Tractors 24a and 24b are positioned electronically on predetermined paths, each path comprising a combination of tangenter motion, illustrated by arrows 28 and 34, and lifter motion illustrated by arrows 30 and 32. The electronic drive and controller (not shown in FIG. 3) control motions on the predetermined paths by applying appropriate electrical waveforms to the actuator segments. Tractors 24a and 24b alternately contact tractee 26 in walking fashion. Smooth walking produces substantially constant tractee velocity, constant net normal force applied to the tractee, constant net tangential tractive force applied to the tractee, and negligible sliding contact between tractors and tractee throughout the walking cycle. Negligible sliding contact, a major characteristic of smooth walking, promotes long-term stable operation, long life, and high electromechanical efficiency.

Figure 4:
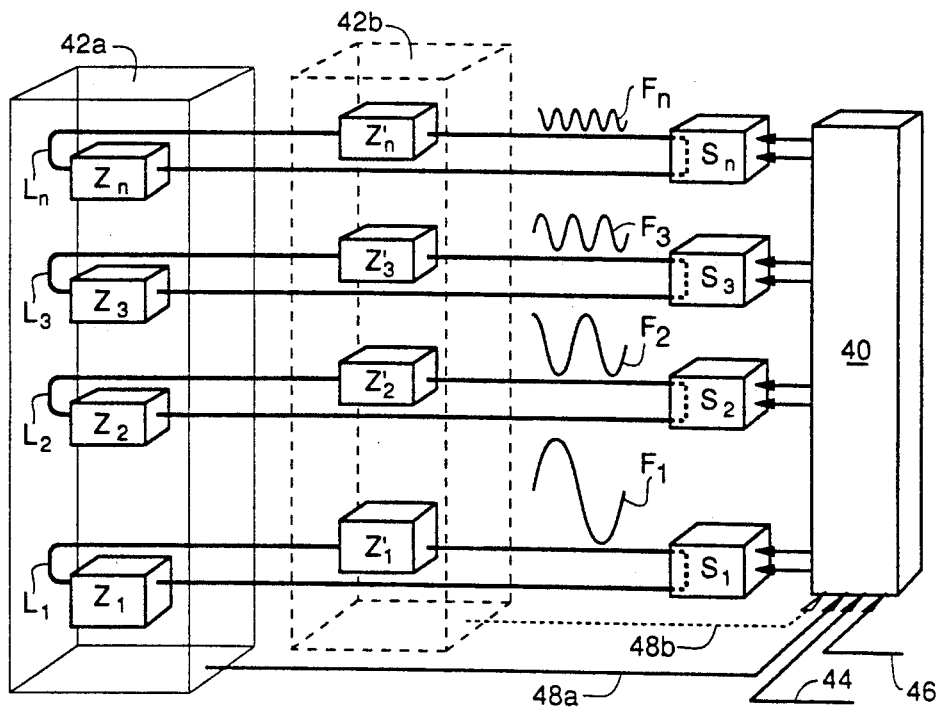
FIG. 4 is a schematic diagram of an electrical drive system of the present invention.

FIG. 4 is a schematic diagram of an embodiment of the electrical system of the present invention. The system comprises a controller 40, a plurality of electrical stimulators $S_1 \ldots S_n$ connected to controller 40, a corresponding plurality of impedances $Z_1 \ldots Z_n$ comprising individual segments of a transducer 42a, a corresponding plurality of second impedances $Z'_1 \ldots Z'_n$ (that may comprise individual segments of a second transducer 42b, illustrated in phantom), and a plurality of electrical loops $L_1 \ldots L_n$ connecting the corresponding stimulators and impedances. Impedances Z normally comprise electrical reactances, such as inductors and/or capacitors. In FIG. 4, the base of transducer 42a (and 42b) is fixed so that the motion of the top of transducer 42a (and 42b) corresponds to the mechanical output waveform. The use of transducer pairs, such as 42a and 42b, provides the benefits of system compactness and simplicity of construction. As connected in FIG. 4, transducer 42b provides an output complementary to that of transducer 42a, such as in the walking motion described above.

External electrical power is supplied to controller 40 on a line 44. Instructions, typically comprising an analog of the desired transducer output, are provided to controller 40 on a line 46. Using the supplied instructions, controller 40 computes and controls the distribution of electrical power to the stimulators to produce the desired transducer output. As an option, the system may include feedback lines 48a and 48b connecting transducers 42a and 42b, respectively, to controller 40. Feedback signals on lines 48a and 48b may represent transducer output states or the relative positions of transducer segments, for example. The amplitude of the electrical signal supplied to each stimulator is a periodic function of time. Each stimulator drives its loop with a resonant electrical signal. The frequency, amplitude, phase, and polarity of the desired response of each loop, represented by $F_1 \ldots F_n$, respectively, are determined by controller 40 from the instructions received on line 46. Resonance of the electrical stimulation is aided by the temporary storage of electrical energy in each loop impedance $Z'$. Impedances $Z'$ may be separate components, or they may comprise output impedance circuits in the stimulators. In the preferred embodiment, impedances Z' comprise segments of second transducer 42b that correspond to the segments (impedances Z) of transducer 42a.

Controller 40 uses the Fourier theorem to select the frequency, amplitude, phase, and polarity of each segment response F. The resonant electrical signal provided on each loop produces the appropriate response F of that loop's actuator segment. The vector sum of the individual segment motions is the overall actuator output. This process is analogous to the synthesis of a nonsinusoidal electrical waveform by electrically adding a plurality of sinusoidal electrical signals. However, the present invention is distinguished from such prior systems by the absence of electrical summing and by the absence of mechanical resonance. The system of the present invention uses electrical resonance and mechanical summing to achieve the desired transducer output.

Figure 5:
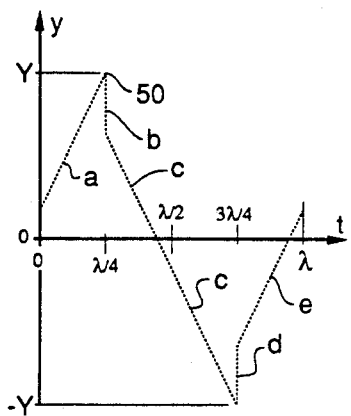
FIG. 5 is a plot of an ideal mechanical waveform for the tangential action of a two-axis, constant velocity, smooth walking piezoelectric actuator.

Transducers 42a and 42b of FIG. 4 may comprise segmented piezoelectric actuators as described above. In this embodiment, the impedances Z and Z' comprise piezoelectric dimorphs (individual dimorphs or groups of dimorphs connected in electrical parallel) that react electrically as capacitances. Referring to FIG. 5, dotted line waveform 50 is an ideal mechanical waveform of the tangential component of a two-axis piezoelectric actuator during smooth walking of an object positioned with constant velocity. Waveform 50 is a plot of tangential position of the actuator foot as a function of time. Tangential force is exerted during portion a of waveform 50 and removed during portion b. Retrace is accomplished during portion c, tangential force is reapplied during portion d, and the new tangential forcing cycle takes place during portion e. In this example, tangential waveform 50 is periodic with period lambda. With the use of bipolar piezoelectric shear elements, waveform 50 is symmetric about a quiescent mechanical position at 0 with extremes of tangential motion indicated as Y and −Y.

Figure 6:
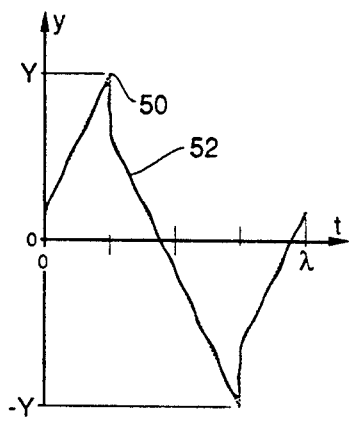
FIG. 6 is a plot of the mechanical sum of six actuator segments approximating the ideal waveform of FIG. 5.

Referring to FIG. 6, waveform 52 illustrates actual tangential motion of a piezoelectric actuator having six segments whose individual tangential motions are summed as vectors. Actual waveform 52 is shown superimposed on ideal waveform 50. In theory, ideal waveform 50 can be achieved by summing the motions of an infinite number of actuator segments driven with separate loops. In practice, however, the sum of a relatively small number of segments adequately emulates the ideal waveform, as shown in FIG. 6.

Figure 7:
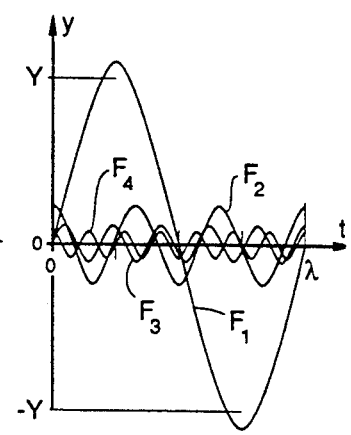
FIG. 7 is a plot of the first four individual waveforms of the six actuator segments that are summed to produce the plot of FIG. 6.

FIG. 7 illustrates the plots of individual output waveforms $F_1 \ldots F_4$ of the first four segments of an actuator. For the case of perfect actuator response, these curves correspond in phase and frequency to the electrical stimulations of loops $L_1 \ldots L_4$, respectively. In this example, half of the loops resonate with sine waves and the other half resonate with cosine waves. For piezoelectric walking, the force of tangential output is varied by adjusting the cosine amplitudes, while the speed of tangential motion is varied by adjusting the sine amplitudes.

Actuator force and speed may be varied independently and simultaneously. In the general case, all the actuator segments (e.g., dimorphs) are driven to the same peak potential that produces the most efficient but safe operation. Amplitude of the output motion of each segment can be changed by adjusting the size of the electrical impedance of each loop. For piezoelectric actuators, the capacitance of each segment can be modified by connecting different numbers of similar dimorphs in electrical parallel. This can be accomplished by the controller, for example, by using electrical switches (not shown) connected in the loops between the stimulators and the transducers. In the example illustrated in FIG. 7, the amplitude of $F_1$ is greater than that of $F_2$ because impedance $Z_1$ is greater than impedance $Z_2$.

Figure 8:
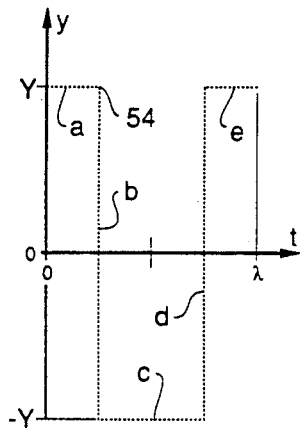
FIG. 8 is a plot of an ideal mechanical waveform for the perpendicular action of a two-axis, smooth walking piezoelectric actuator.
Figure 9:
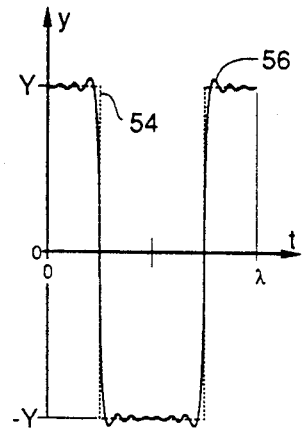
FIG. 9 is a plot of the mechanical sum of six actuator segments approximating the ideal waveform of FIG. 8.

Referring to FIG. 8, waveform 54 is a dotted line plot of the ideal transducer output y as a function of time t for the perpendicular actuating portion (lifter) of a two-axis piezoelectric walking actuator. The actuator applies normal force to a tractee during portion a of waveform 54, removes normal force and lifts the foot clear of the tractee during portion b, awaits retrace by the tangenter during portion c, reapplies the foot to the tractee during portion d, and reapplies normal force during portion e for the next traction cycle. FIG. 9 shows a truncated series Fourier waveform 56, comprising the vector sum of six individual lifter segments, overlaid on the ideal waveform 54, illustrating the close approximation achieved with relatively few independently stimulated actuator segments.

Figure 10:
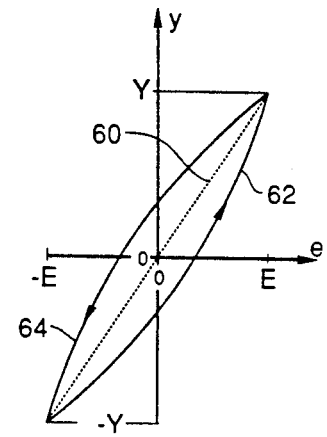
FIG. 10 is a plot of 30% piezoelectric segment hysteresis.

The foregoing description has generally assumed linear actuator response to electrical stimulation. Actual transducers, however, have a nonlinear response. Bipolar driven shear piezoelectric actuators, when symmetrically stimulated to amplitudes lower than those causing saturation, have a nonlinearity, or hysteresis, similar to that illustrated in FIG. 10. The tractor position y is plotted in FIG. 10 as a function of applied electric potential e. An ideal linear transducer would respond as indicated by the dotted line 60. Curve 62 illustrates 30% lagging of actuator segment motion as the electric potential increases from the minimum potential −E, and curve 64 illustrates the same lagging as the potential decreases from the maximum of E.

Figure 11:
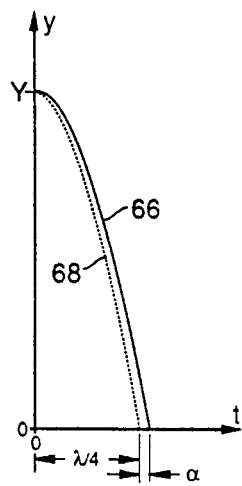
FIG. 11 is a quarter-cycle plot showing the hysteresis lag of a piezoelectric segment.

FIG. 11 shows a quarter-cycle plot of the position of an actuator segment stimulated by a sine wave. The actual segment position 66 lags the ideal linear response 68 by the time alpha. Phase lag alpha is a time delay distortion caused by the piezoelectric hysteresis illustrate in FIG. 10. Actual response 66 also suffers from wave shape, or harmonic, distortion.

Figure 12:
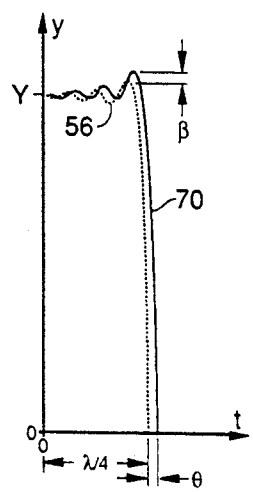
FIG. 12 is a quarter-cycle plot showing the hysteresis lag of the perpendicular action of a piezoelectric actuator.

FIG. 12 shows a quarter-cycle response of a piezoelectric lifter. Dotted line 56 is the six-loop linear Fourier synthesized waveform of FIG. 9, and waveform 70 is the actual six-loop Fourier response including the time delay and harmonic distortions described above. To a first order approximation, the actuator time delay theta is the algebraic sum of segment delays alpha of FIG. 11, and the amplitude error beta is the algebraic sum of the harmonic distortions.

Figure 13:
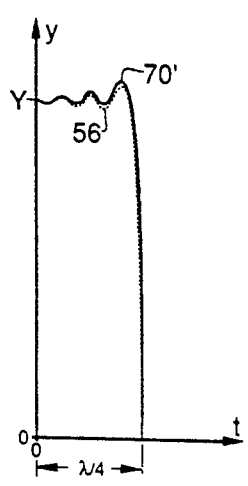
FIG. 13 is a quarter cycle plot showing the perpendicular action when the hysteresis time delay illustrated in FIG. 11 is subtracted from the activation time of each segment of the actuator.

Referring to FIG. 13, waveform 70' is the actual six-loop Fourier response of FIG. 12 except that the time delays alpha are subtracted from respective loop activation times. This is called a phase, or time domain, correction. As illustrated in FIG. 13, corrections for alpha in the time domain significantly reduce the deviation from the linear synthesis of waveform 56. Because of the complex coupling of time delay and harmonic distortions, the amplitude error beta is also reduced. As a result, easily made time domain corrections provide a more accurate transducer output than that achieved from conventional whole-body drive of the same nonlinear transducer. In the preferred embodiment, controller 40 phase locks all loops to the loop having the highest frequency, thereby allowing relative phase corrections to be applied to the appropriate loops. Furthermore, the Fourier synthesis and time domain corrections practiced by the present invention reduce or eliminate many second order distortions such as piezoelectric drift.

Electrical transducers temporarily store electric and elastic energy. In an ideal resonant system, the stimulators supply only the electrical power that is to be converted into mechanical work, and the energy stored in loops as reactive power and elastic strain is recirculated without loss. Electrical loops for segmented transducers can be made with low resistance by eliminating semiconductor components. Semiconductors can be relegated to the controller sides of the stimulators, for example.

Many applications of the piezoelectric embodiment of the present invention allow substantial departure from the ideal smooth walking waveform. For example, a piezoelectric replacement for an hydraulic actuator allows considerably rougher running than a positioner for an optical element. For coarse running applications, a less accurate approximation of the Fourier sum can be tolerated. This allows connection of dimorphs into fewer series loops, which simplifies control. The relatively greater capacitance of larger dimorph groups may allow operation of each loop at a lower frequency, with larger charge transfer swings (i.e., reactive currents) that provide longer strokes. When each series loop is constructed with the least practical electrical resistance, very large reactive currents can be handled. When larger reactive currents flow with relatively reduced resistive dissipation, efficiency is improved. Large reactive currents also increase the speed of actuation, allowing greater power extraction from the actuators.

As an example of an alternative embodiment of the present invention, piezoelectric actuator capacitances can be replaced by inductances, each actuator inductance being a separate solenoid. In this embodiment, all members of a first group of solenoids are colinear around a magnetostrictive rod. The mechanical stroke at one end of the magnetostrictive rod is a nonsinusoidal waveform that is the truncated Fourier sum of the strokes induced by each solenoid. Capacitors or inductors can be used as ancillary electrical storage components in an embodiment not having a second group of electrically connected solenoids. With a second group of solenoids actuating a second magnetostrictive rod, each solenoid of the second group is connected to a respective solenoid of the first group in a loop similar to that previously described for piezoelectric dimorphs. In yet another embodiment, the dimorphs and solenoids described above can be replaced by actuators comprising electrically heated segments of a thermal expansion material. It can be seen from the foregoing examples that although the types of segmented actuators may vary considerably, the principles of the electrical drive system of the present invention remain the same.

A wide variety of stroke waveforms can be generated by the present invention by selection of appropriate loop frequencies and Fourier coefficient amplitudes. Uses for the various embodiments of the invention include smooth walking actuators, electromagnetic motors, and thermal expansion actuators. Nonsinusoidal periodic output is an advantage in many applications because predetermined portions of each actuator stroke may require different magnitudes of force, velocity, and acceleration.

Although the present invention has been described with respect to specific embodiments thereof, various changes and modifications may be suggested to one skilled in the art. Therefore, it is intended that the present invention encompass such changes and modifications as fall within the scope of the appended claims.

I claim:

1. An electrical system for driving a transducer, comprising:
    a plurality of segments coupled to form the transducer, each of said transducer segments comprising an electrical impedance;
    a plurality of second electrical impedances;
    a plurality of electrical loops, each of said loops connecting one of the transducer segments in electrical series with a corresponding one of said second electrical impedances;
    means for resonantly stimulating the plurality of electrical loops to produce a predetermined nonsinusoidal transducer output; and
    means for coupling said stimulating means to each of said plurality of loops.

2. The electrical system of claim 1, wherein said stimulating means comprises an electrical controller for generating resonant electrical signals in said loops to produce transducer segment outputs, said nonsinusoidal transducer output comprising a vector sum of the transducer segment outputs.

3. The electrical system of claim 2, wherein said electrical controller generates a plurality of resonant electrical signals related in frequency, phase, amplitude, and polarity, each of said signals for stimulating one of the transducer segments.

4. The electrical system of claim 3, wherein each of said resonant electrical signals attains an oscillatory state between the transducer segment and the second impedance in each of the respective loops.

5. The electrical system of claim 4, wherein each of the transducer segments comprises a magnetic actuator segment.

6. The electrical system of claim 5, wherein each of the magnetic actuator segments comprises an inductor forming an electromagnetic solenoid.

7. The electrical system of claim 4, wherein each of the transducer segments comprises a thermal expansion actuator segment.

8. The electrical system of claim 4, wherein the transducer comprises a first piezoelectric actuator, each of the transducer segments comprises a piezoelectric element, and each of said second impedances comprises a capacitance.

9. The electrical system of claim 8, wherein each of said capacitances comprises a segment of a corresponding second piezoelectric actuator.

10. The electrical system of claim 9, wherein said electrical signals attain said oscillatory state between corresponding segments of the first and second actuators, thereby producing complementary nonsinusoidal motion of the first and second actuators.

11. An electrical system for driving a segmented piezoelectric actuator, comprising:
    a plurality of piezoelectric elements mechanically coupled to form the actuator segments, each of said segments comprising an electrical capacitance;
    a plurality of second electrical capacitances;
    a plurality of electrical loops, each of said loops connecting one of the actuator segments in electrical series with a corresponding one of said second electrical capacitances;

a controller for electrically stimulating the actuator segments to generate segment motions, a vector sum of said segment motions comprising a predetermined nonsinusoidal actuator motion composed of sinusoidal mechanical actions; and means for coupling said controller to each of said plurality of loops.

12. The electrical system of claim 11, wherein said controller generates a plurality of electrical signals related in frequency, phase, amplitude, and polarity, each of said signals for stimulating one of the actuator segments.

13. The electrical system of claim 12, wherein each of said electrical signals attains an oscillatory state between the actuator segment and the second capacitance in each of the respective loops.

14. The electrical system of claim 13, wherein each of said second capacitances comprises a corresponding segment of a second actuator.

15. The electrical system of claim 14, wherein said electrical signals attain said oscillatory state between said corresponding segments of the first and second actuators, thereby producing complementary nonsinusoidal motion of the first and second actuators.

16. The electrical system of claim 15, wherein said complementary nonsinusoidal motion comprises smooth walking motion of the actuators.

17. A method of electrically stimulating a transducer to produce a nonsinusoidal output, comprising the steps of:

providing a plurality of segments coupled to form the transducer, each of said segments comprising an electrical impedance;

providing a plurality of second electrical impedances;

providing a plurality of electrical loops, each of said loops connecting one of the transducer segments in electrical series with a corresponding one of said second electrical impedances; and stimulating each of said loops with a resonant electrical signal to produce the nonsinusoidal transducer output.

18. The method of claim 17, wherein the step of stimulating the transducer comprises generating the resonant electrical signals in said loops to produce transducer segment outputs, the nonsinusoidal transducer output comprising a vector sum of the transducer segment outputs.

19. The method of claim 18, wherein the step of generating resonant electrical signals comprises generating a plurality of electrical signals related in frequency, phase, amplitude, and polarity, each of said signals stimulating one of the transducer segments.

20. The method of claim 19, wherein the step of generating electrical signals comprises generating an oscillatory state between the transducer segment and the second impedance in each of the respective loops.

21. The method of claim 20, wherein the step of providing a plurality of transducer segments comprises providing a plurality of piezoelectric elements coupled to form a piezoelectric actuator.

22. The method of claim 21, wherein the step of providing second impedances comprises providing a second plurality of piezoelectric elements forming a second piezoelectric actuator.

23. The method of claim 22, wherein the step of stimulating the loops comprises stimulating corresponding ones of said first and second plurality of elements to produce smooth walking motion by the actuators.

24. The method of claim 20, wherein the step of providing a plurality of transducer segments comprises providing a plurality of electromagnetic segments coupled to form an electromagnetic actuator.

25. The method of claim 24, wherein the step of providing the plurality of electromagnetic segments comprises providing a plurality of electrical inductances comprising solenoids.

26. The method of claim 25, wherein the step of providing second impedances comprises providing a second plurality of solenoids forming a second electromagnetic actuator.

27. The method of claim 20, wherein the step of providing a plurality of transducer segments comprises providing a plurality of thermal expansion segments coupled to form a thermal expansion actuator.

* * * * *